United States Patent
Okada et al.

(10) Patent No.: US 9,157,931 B2
(45) Date of Patent: Oct. 13, 2015

(54) PROBE CARD

(71) Applicants: Akira Okada, Tokyo (JP); Hajime Akiyama, Tokyo (JP); Kinya Yamashita, Tokyo (JP)

(72) Inventors: Akira Okada, Tokyo (JP); Hajime Akiyama, Tokyo (JP); Kinya Yamashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 184 days.

(21) Appl. No.: 13/783,081

(22) Filed: Mar. 1, 2013

(65) Prior Publication Data

US 2013/0321019 A1 Dec. 5, 2013

(30) Foreign Application Priority Data

Jun. 5, 2012 (JP) .................................. 2012-127685

(51) Int. Cl.
*G01R 1/073* (2006.01)
*G01R 1/067* (2006.01)

(52) U.S. Cl.
CPC ............ *G01R 1/073* (2013.01); *G01R 1/06733* (2013.01); *G01R 1/06716* (2013.01); *G01R 1/07342* (2013.01)

(58) Field of Classification Search
CPC ......................... G01R 31/2891; G01R 31/2887
USPC ........................ 324/756.03, 755.07
See application file for complete search history.

(56) References Cited

U.S. PATENT DOCUMENTS

| | | | |
|---|---|---|---|
| 6,334,480 B1* | 1/2002 | Lim et al. ..................... | 165/80.3 |
| 6,811,406 B2 | 11/2004 | Grube | |
| 7,495,458 B2* | 2/2009 | McClanahan et al. ... | 324/750.03 |
| 7,602,204 B2 | 10/2009 | Lee | |
| 2003/0016497 A1* | 1/2003 | Matsui et al. ................. | 361/695 |
| 2006/0205323 A1* | 9/2006 | Togawa et al. .................... | 451/7 |

(Continued)

FOREIGN PATENT DOCUMENTS

| | | |
|---|---|---|
| CN | 2181697 Y | 11/1994 |
| CN | 2677944 Y | 2/2005 |

(Continued)

OTHER PUBLICATIONS

An Office Action; "Notification of Reasons for Refusal," issued by the Japanese Patent Office on Nov. 18, 2014, which corresponds to Japanese Patent Application No. 2012-127685 and is related to U.S. Appl. No. 13/783,081; with English language partial translation.

(Continued)

*Primary Examiner* — Tung X Nguyen
*Assistant Examiner* — Alesa Allgood
(74) *Attorney, Agent, or Firm* — Studebaker & Brackett PC (57) ABSTRACT

It is an object of the present invention to provide a probe card capable of controlling generation of a scratch or an indentation in a connection pad and capable of controlling generation of heat in a connection pad and its vicinity having contacted a contact probe at low cost and in a simple way. A probe card includes a probe substrate, at least one contact probe electrically connected to a signal line provided to an insulating base of the probe substrate and fixed to the insulating base, and at least one engagement member installed on the contact probe at a position near a tip end portion of the contact probe. The engagement member has at least one engagement portion that makes abutting contact with another predetermined member during operation to restrain the operation of the contact probe.

12 Claims, 9 Drawing Sheets

(56) References Cited

U.S. PATENT DOCUMENTS

| | | | |
|---|---|---|---|
| 2008/0164900 A1* | 7/2008 | Ku et al. | 324/762 |
| 2008/0186041 A1 | 8/2008 | Lee | |
| 2008/0191726 A1* | 8/2008 | Ku et al. | 324/762 |
| 2010/0278211 A1 | 11/2010 | Pu et al. | |
| 2011/0062978 A1 | 3/2011 | Kister | |
| 2015/0192615 A1 | 7/2015 | Kister | |

FOREIGN PATENT DOCUMENTS

| | | |
|---|---|---|
| CN | 2684199 Y | 3/2005 |
| CN | 101315391 A | 12/2008 |
| CN | 101876683 A | 11/2010 |
| JP | H03-122370 U | 12/1991 |
| JP | 05-109847 A | 4/1993 |
| JP | H11-352151 A | 12/1999 |
| JP | 2003-347370 A | 12/2003 |
| JP | 2006-329871 A | 12/2006 |
| JP | 2008-525793 A | 7/2008 |

OTHER PUBLICATIONS

The First Chinese Office Action issued by the Chinese Patent Office on May 29, 2015, which corresponds to Chinese Patent Application No. 201310067334.6 and is related to U.S. Appl. No. 13/783,081; with English language partial translation.

* cited by examiner

PROBE CARD

BACKGROUND OF THE INVENTION

1. Field of the Invention

The present invention relates to a probe card with a contact probe used in measuring and evaluating the electrical characteristics of a semiconductor device.

2. Background Art

During measurement and evaluation of the electrical characteristics of a semiconductor device, a contact probe provided to a probe card is used to electrically connect a connection pad provided on a surface of the semiconductor device and an external measuring unit and the like. Generally, the contact probe is made of a material harder than that of the connection pad. So, pressure applied by pressing the contact probe against the connection pad generates a scratch or an indentation in a surface of the connection pad. If such damage is increased by application of excessive pressure, the semiconductor device may be broken partially to generate serious failure. Even if the semiconductor device is not broken, a subsequent bonding step may be affected adversely. According to a conventional testing method (disclosed in Japanese Patent Application Laid-Open No. 2006-329871, for example), the aforementioned indentation is avoided by using a conductive liquid substance as an intermediary.

A tip end of the contact probe generally has a projecting shape in the form of a needle. So, during measurement and evaluation of the electrical characteristics of a semiconductor device with the contact probe, a current density increases steeply at the tip end of the contact probe when a current is applied. The steep increase of the current density generates sudden heat generation in a surface and its vicinity of the semiconductor device including a connection pad having contacted the contact probe, thereby generating damage on the connection pad or partial breakdown of the semiconductor device. According to conventional technique (disclosed in Japanese Patent Application Laid-Open No. 5-109847 (1993), for example), such heat generation is avoided by cooling with a fluid.

However, measurement and evaluation of Japanese Patent Application Laid-Open No. 2006-329871 using a conductive liquid substance as an intermediary involves application of the conductive liquid substance on each connection pad before the measurement and evaluation, and removal of the conductive liquid substance after the measurement and evaluation. This becomes an obstacle to cost reduction and facilitation of manufacturing steps.

Further, use of a cooling unit to cool a heating element in Japanese Patent Application Laid-Open No. 5-109847 involves modification of a chuck stage of a measuring and evaluating device. This generates a problem of extremely high cost, especially if a plurality of measuring and evaluating devices is provided.

SUMMARY OF THE INVENTION

It is an object of the present invention to provide a probe card capable of controlling generation of a scratch or an indentation in a connection pad and capable of controlling generation of heat in a connection pad and its vicinity having contacted a contact probe at low cost and in a simple way.

A probe card of the present invention includes a probe substrate, at least one contact probe electrically connected to a signal line provided to an insulating base of the probe substrate and fixed to the insulating base, and at least one engagement member installed on the contact probe at a position near a tip end portion of the contact probe. The engagement member has at least one engagement portion that makes abutting contact with another predetermined member during operation to restrain the operation of the contact probe.

According to the present invention, the probe card includes a probe substrate, at least one contact probe electrically connected to a signal line provided to an insulating base of the probe substrate and fixed to the insulating base, and at least one engagement member installed on the contact probe at a position near a tip end portion of the contact probe. The engagement member has at least one engagement portion that makes abutting contact with another predetermined member during operation to restrain the operation of the contact probe. So, generation of a scratch or an indentation in a connection pad can be controlled and generation of heat in a connection pad and its vicinity having contacted the contact probe can be controlled at low cost and in a simple way.

These and other objects, features, aspects and advantages of the present invention will become more apparent from the following detailed description of the present invention when taken in conjunction with the accompanying drawings.

EMBODIMENT FOR CARRYING OUT THE INVENTION

Preferred embodiments of the present invention are described in detail below by referring to the drawings.

First Preferred Embodiment

The structure of a probe card 1 is described first.

Figure 1:
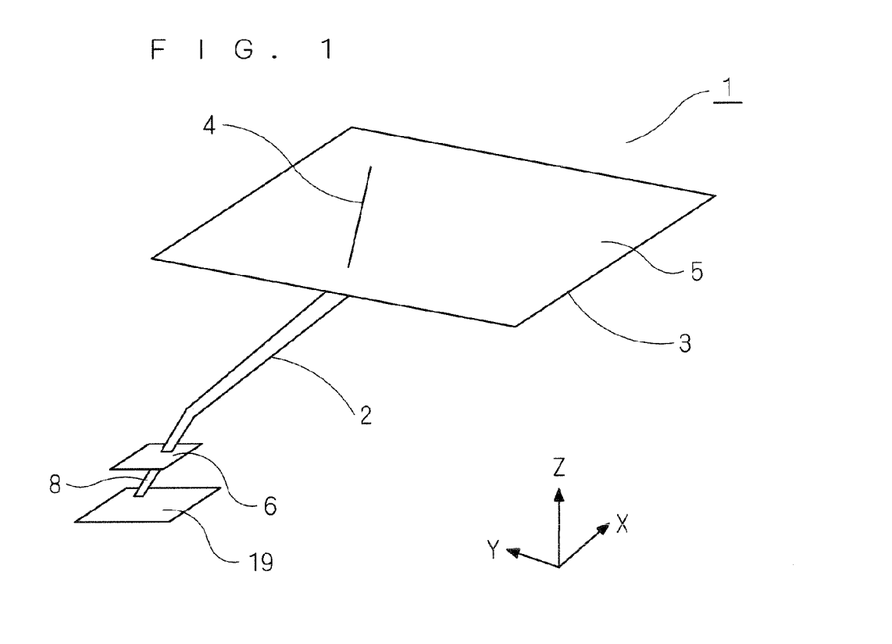
FIG. 1 shows an exemplary structure of a probe card of a first preferred embodiment of the present invention.

FIG. 1 shows an exemplary structure of a probe card 1 of a first preferred embodiment of the present invention. During measurement and evaluation of the electrical characteristics of a semiconductor device 19, the contact card 1 of the first preferred embodiment is used to electrically connect a connection pad provided on a surface of the semiconductor device 19 and an external measuring unit and the like. As shown in FIG. 1, the probe card 1 includes a contact probe 2 capable of contacting a connection pad (not shown in the drawings) provided on the surface of the semiconductor device 19, a probe substrate 3 for installation of the contact probe 2, and an engagement member 6 that restrains the operation of the contact probe 2.

The contact probe 2 is mechanically fixed through resin and the like (not shown in the drawings) to an insulating base 5 being a base of the probe substrate 3. The contact probe 2 is electrically connected through an electrical wire or directly through solder and the like to a signal line 4 provided to the insulating base 5. The engagement member 6 is installed on the contact probe 2 near a tip end portion 8 of the contact probe 2.

The engagement member 6 has heat dissipating effect, and restrains the operation of the contact probe 2 by making abutting contact with another member while the contact probe 2 is in operation. While the engagement member 6 is only shown in outline as a simple plate in FIG. 1, an exemplary shape thereof is described in detail later by referring to FIG. 3.

The structure of the contact probe 2 is described in detail next.

Figures 2A, 2B:
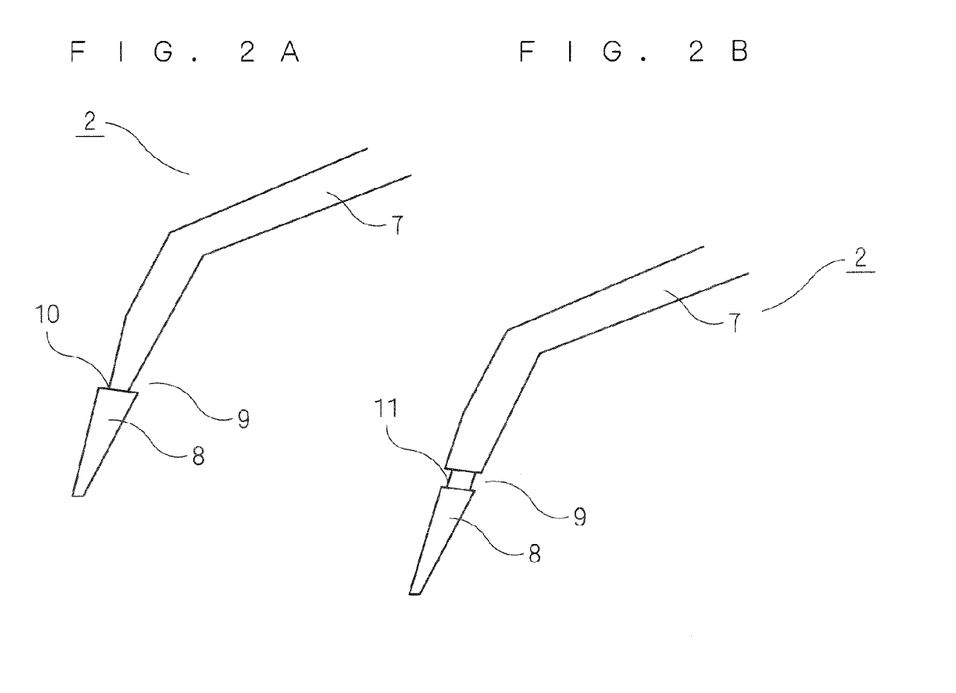
FIGS. 2A and 2B show an exemplary shape of a contact probe of the first preferred embodiment of the present invention.

FIG. 2 shows an exemplary shape of the contact probe 2 of the first preferred embodiment. As shown in FIG. 2, the contact probe 2 of the first preferred embodiment includes an axial portion 7, an attachment portion 9 formed continuously with the axial portion 7, and the tip end portion 8 capable of contacting a connection pad provided on the surface of the semiconductor device 19. FIG. 2 shows the principal part of the contact probe 2. The contact probe 2 is made of a metallic material having conductivity such as tungsten and rhenium tungsten. Although not shown in FIG. 2, the axial portion 7 may be provided with a curved part 17 described later (see FIG. 6, for example).

The attachment portion 9 is a member for installation of the engagement member 6, and is provided near the tip end of the axial portion 7. Regarding the shape of the attachment portion 9, the attachment portion 9 may have a stepped part 10 of FIG. 2A or a recessed part 11 of FIG. 2B. The shape of the attachment portion 9 is not limited to those of FIGS. 2A and 2B, but it may be any shape that allows the engagement member 6 to be fixed stably to the contact probe 2.

The structure of the engagement member 6 is described in detail next.

Figure 3:
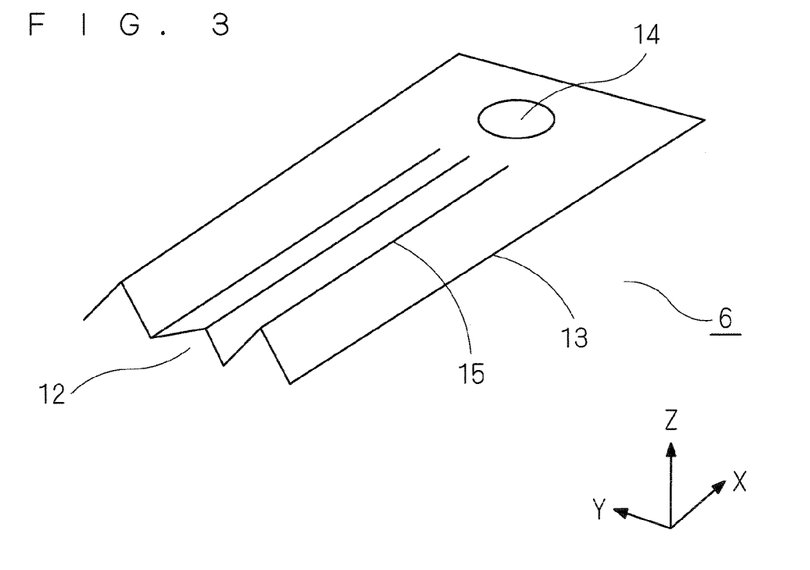
FIG. 3 shows an exemplary shape of an engagement member of the first preferred embodiment of the present invention.

FIG. 3 shows an exemplary shape of the engagement member 6 of the first preferred embodiment. As shown in FIG. 3, the engagement member 6 of the first preferred embodiment includes a body portion 13 having heat dissipating effect specifically and functioning as a base, an attachment hole 14 provided for installation of the engagement member 6 on the contact probe 2, and an engagement portion 12 that makes abutting contact with another member to restrain the operation of the contact probe 2. The engagement member 6 further includes at least one folded part 15 provided to the body portion 13 by folding process. The folded part 15 is intended to increase rigidity in order to avoid curvature, torsion or the like of the body portion 13 that might occur when the engagement portion 12 makes abutting contact with another member. The engagement member 6 is made of a plate-like metallic material having heat conductivity such as copper and aluminum.

Figure 4:
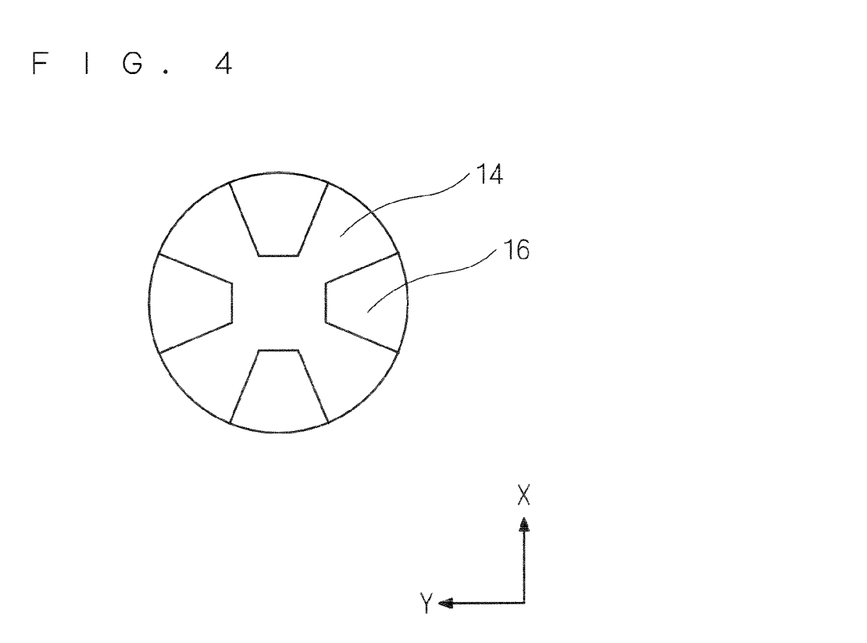
FIG. 4 shows an exemplary shape of an attachment hole provided to the engagement member of the first preferred embodiment of the present invention.

FIG. 4 shows an exemplary shape of the attachment hole 14. As shown in FIG. 4, the attachment hole 14 is provided with a plurality of turnbacks 16 integral with the body portion 13 and formed along the inner circumference of the attachment hole 14.

Figure 5:
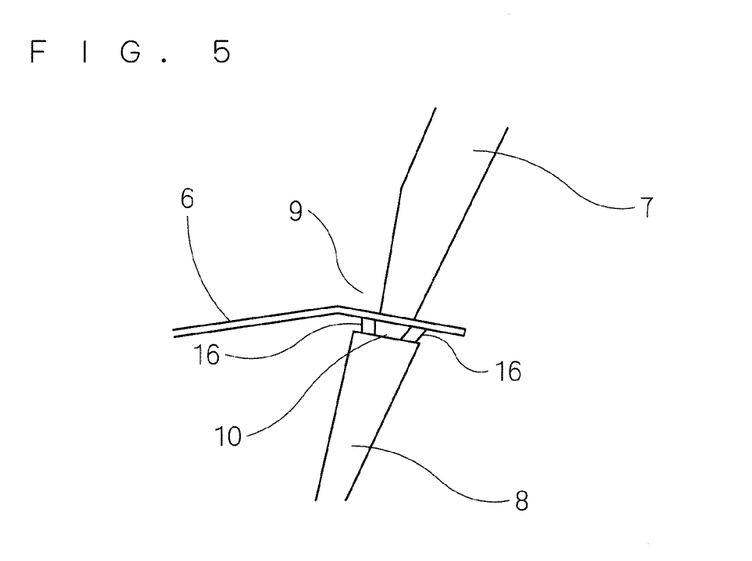
FIG. 5 shows a condition where the engagement member of the first preferred embodiment of the present invention is installed on the contact probe.

FIG. 5 shows a condition where the engagement member 6 is installed on the contact probe 2. As shown in FIG. 5, inserting the tip end portion 8 of the contact probe 2 in the attachment hole 14 locks the turnbacks 16 in the concave shape of the attachment portion 9 such as the stepped part 10 on the recessed part 11, thereby installing the engagement member 6 on the contact probe 2.

The engagement portion 12 of FIG. 3 has a (concave) shape determined based on the assumption that another member to make abutting contact with the engagement portion 12 is another contact probe 2. However, this is not the only shape of the engagement portion 12. If another member to make abutting contact with the engagement portion 12 is an engagement portion 12 of an engagement member 6 installed on another contact probe 2, for example, the engagement portion 12 may have a shape that allows fit between the engagement portion 12 and the another member (the engagement portion 12 of the engagement member 6 installed on the another contact probe 2).

If another member to make abutting contact with the engagement portion 12 is another contact probe 2, and if electrical isolation from the another contact probe 2 is required, an insulating material may be added to the engagement portion 12. In this case, application of a current places the engagement portion 12 in high temperature. This may be handled effectively by use of an insulating resin having resistance to heat. However, this is not the only way of handling the high temperature.

The operation of the contact probe 2 is described next.

Figure 6:
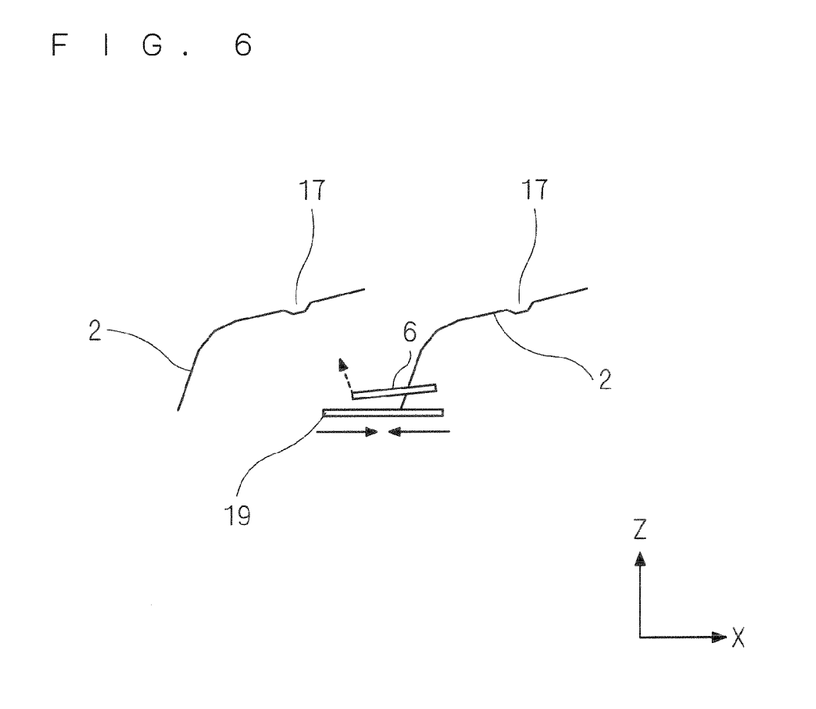
FIG. 6 shows an example of the operation of the probe card of the first preferred embodiment of the present invention.

FIG. 6 shows an example of the operation of the probe card 1 of the first preferred embodiment. To be specific, FIG. 6 shows a condition where the contact probe 2 initially contacts a connection pad provided on the surface of the semiconductor device 19 in response to downward movement of the probe card 1 of FIG. 1 in the Z axis direction. In FIG. 6, two contact probes 2 are arranged to face each other.

As shown in FIG. 6, the two contact probes 2 are fixed to the probe substrate 3 (not shown in FIG. 6). In response to downward movement of the probe card 1 in the Z axis direction (movement in the −Z axis direction), the respective tip end portions 8 of the contact probes 2 move so as to get closer to each other in the X axis direction (see arrows of FIG. 6 shown below the semiconductor device 19).

If the respective tip end portions 8 of the contact probes 2 get closer to each other, the engagement portion 12 of the engagement member 6 installed on the contact probe 2 shown on the right side of FIG. 6 makes abutting contact with the stepped part 10 of the opposite contact probe 2 (contact probe 2 shown on the left side of FIG. 6). This abutting contact stops the operation of the engagement member 6. Stopping the operation of the engagement member 6 also stops the operations of the contact probes 2.

The contact probes 2 each have at least one curved part 17 provided to the axial portion 7. The curved part 17 flexes more preferentially than the other part of the contact probe 2, thereby allowing the tip end portions 8 to move easily in the X axis direction.

Figure 7:
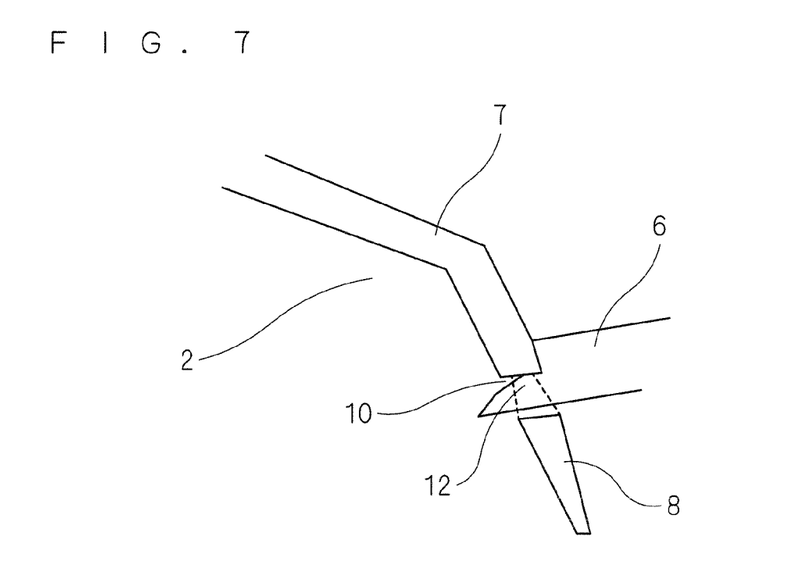
FIG. 7 shows a condition where the engagement member of the first preferred embodiment of the present invention is engaged.

FIG. 7 shows a condition where the engagement member 6 makes abutting contact with the contact probe 2. As shown in FIG. 7, the stepped part 10 of the contact probe 2 on which the engagement member 6 is not installed (contact probe 2 shown on the left side of FIG. 6) has a tapered shape pointing in a direction opposite a direction of the stepped part 10 of FIG. 2A. The engagement portion 12 on the side of the contact probe 2 on which the engagement member 6 is installed (contact probe 2 shown on the right side of FIG. 6) moves toward the stepped part 10 along the tapered shape (moves in the direction of a dashed arrow of FIG. 6), and then stops there. The engagement portion 12 is provided rigidity increased by the folded part 15 (reinforced). Thus, at this time, the engagement portion 12 does not flex, so that the operations of the respective tip end portions 8 of the contact probes 2 are stopped.

As described above, abutting contact between the stepped part 10 of the contact probe 2 on which the engagement member 6 is not installed and the engagement portion 12 on the side of the contact probe 2 on which the engagement member 6 is installed stops the operations of these contact probes 2. Thus, a contact area between the tip end portions 8 of the contact probes 2 and a connection pad on the surface of the semiconductor device 19 dose not extend further in the X axis direction. As a result, a scratch will not be generated additionally in the contact area, namely, in the surface of the connection pad. The downward movement of the probe card 1 in the Z axis direction stops after the aforementioned abutting contact is formed. Meanwhile, even if the probe card 1 moves downward further in the Z axis direction, stress generated by the downward movement can generally be absorbed by the curved parts 17 of the axial portions 7. As a result, a deeper indentation will not be formed in the surface of the connection pad. In the description above, the stepped part 10 of the contact probe 2 is shown as an example. Meanwhile, the recessed part 11 of FIG. 2B may take the place of the stepped part 10.

While the abutting contact is formed as shown in FIG. 7, a current is applied to the contact probes 2 to measure and evaluate the electrical characteristics of the semiconductor device 19. In many cases, a contact area between the respective tip end portions 8 of the contact probes 2 and a connection pad generally has a diameter of about 100 μm, although this diameter depends on the value of a current to be applied. A current of some amperes is applied to such a tiny contact area, although this current value depends on the semiconductor device 19 targeted for measurement and evaluation. So, a current of considerably high density is generated in the contact area to place the contact area and its neighboring area (including the connection pad) in high temperature. In response, the first preferred embodiment is capable of dissipating heat through the engagement member 6 having high heat conductivity. This suppresses temperature increase of the tip end portions 8 and the connection pad, so that serious damage due to heat is not generated in the semiconductor device 19.

Even if the engagement member 6 dose not dissipate heat effectively to generate thermal expansion of the axial portion 7 of the contact probe 2, the thermal expansion can generally be absorbed by the curved part 17 of the axial portion 7. As a result, a deeper indentation will not be formed in the surface of the connection pad.

As described above, the probe card 1 of the first preferred embodiment prevents contact of the contact probe 2 with a connection pad under excessive pressure, so that generation of a scratch or an indentation in the connection pad is controlled. As a result, the electrical characteristics of the semiconductor device 19 are measured and evaluated at higher reliability, and the yield of the semiconductor device 19 is enhanced. Additionally, controlling generation of heat in a connection pad and its vicinity having contacted the contact probe 2 makes it possible to prevent damage on the connection pad or partial breakdown of the semiconductor device 19. As a result, the yield of the semiconductor device 19 is enhanced.

Figure 8:
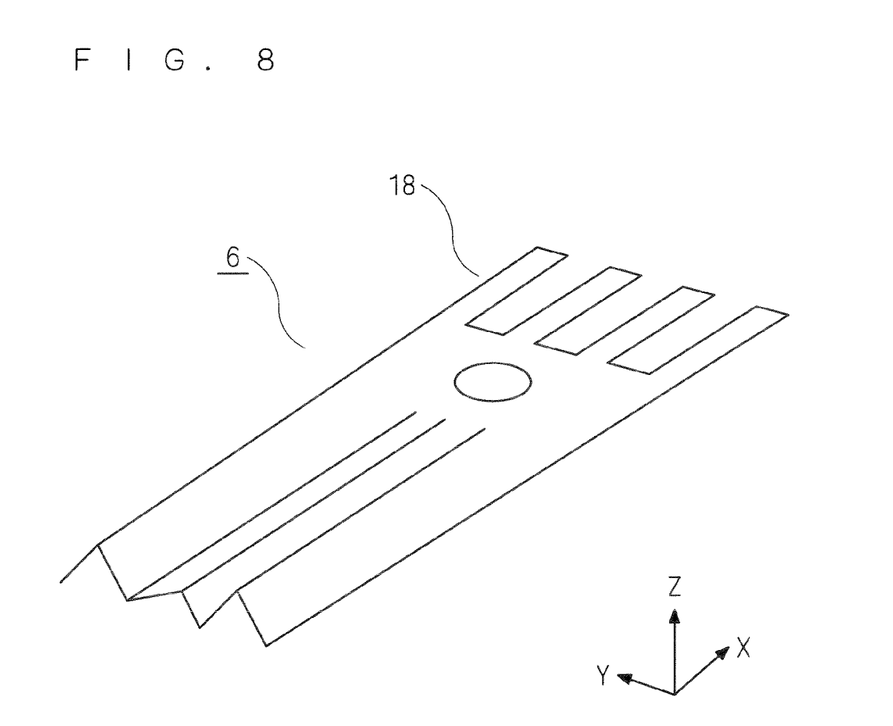
FIGS. 8 and 9 each show an exemplary shape of the engagement member of the first preferred embodiment of the present invention.

The engagement member 6 described in the first preferred embodiment has the shape of FIG. 3. However, this is not the only shape of the engagement member 6 but the engagement member 6 may have the shape of FIG. 8. The shape of FIG. 8 is the same as that of FIG. 3, except for that at least one fin portion 18 is formed at an edge surface of the engagement member 6. If the engagement member 6 has the shape of FIG. 8, heat dissipation is facilitated (heat is dissipated more effectively), thereby suppressing temperature increase more effectively. The fin portion 18 is not always formed at one edge portion as shown in FIG. 8 but it may be formed further at a different edge surface of the engagement member 6, although formation thereof depends on a position relative to an adjacent contact probe 2. In this case, heat is dissipated still more effectively.

Figure 9:
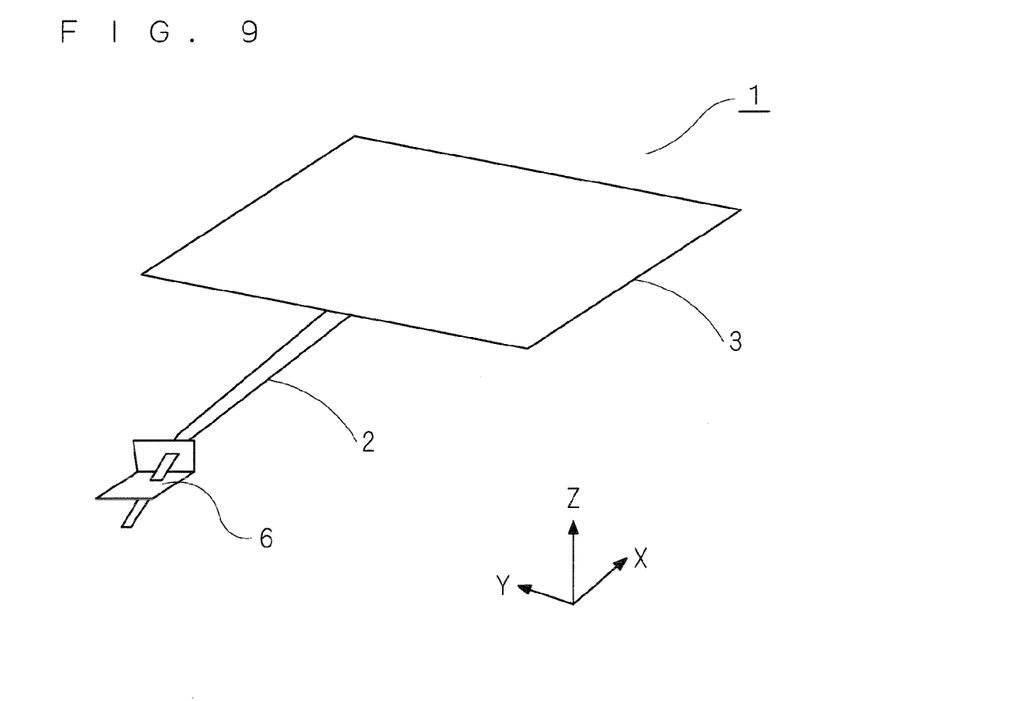

As shown in FIG. 9, the engagement member 6 may be installed so as to contact at least two places the contact probe 2. The engagement member 6 of FIG. 9 contacts two places of the contact probe 2. Meanwhile, the engagement member 6 may contact a plurality of places except two places of the contact probe 2. Making the engagement member 6 contact a plurality of places of the contact probe 2 allows the engagement member 6 to be installed more stably on the contact probe 2. Further, increasing the number of contact places achieves more effective heat dissipation.

Figure 10:
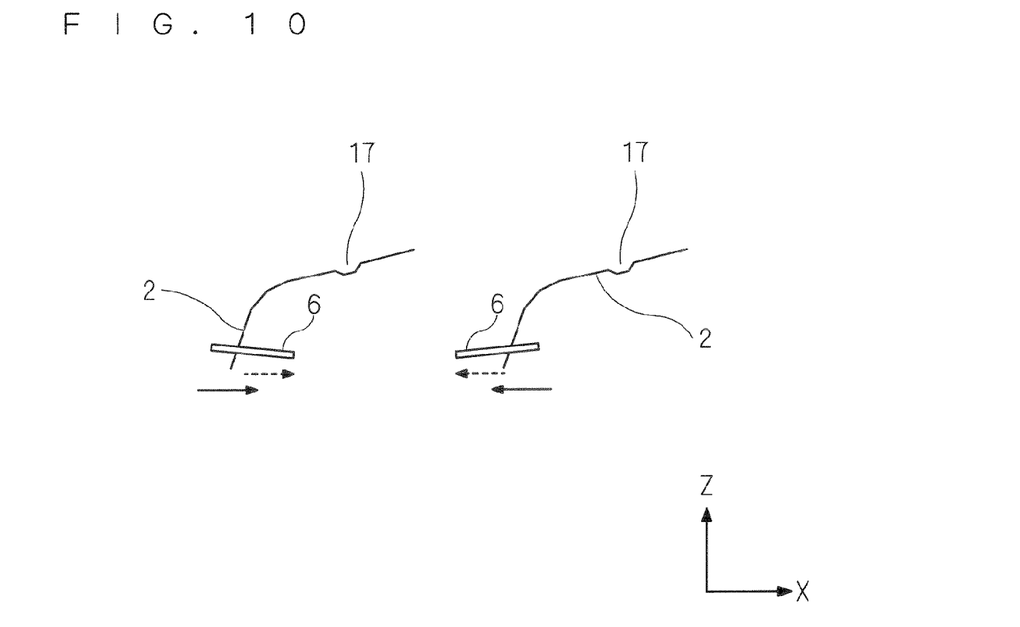
FIGS. 10 and 11 each show exemplary operation of the probe card of the first preferred embodiment of the present invention.

As shown in FIG. 6, another member to make abutting contact with the engagement portion 12 of the engagement member 6 is described as the opposite contact probe 2. However, this is not only the case but the structure of FIG. 10 is also applicable. In FIG. 10, the aforementioned another member is the engagement member 6 installed on the opposite contact probe 2. Employing the structure of FIG. 10 spaces the contact probes 2 apart from each other. Further, if it is difficult to form abutting contact between the engagement portions 12 by using one engagement member 6 having rigidity, use of the engagement members 6 installed on the corresponding contact probes 2 allows the engagement portions 12 to be in abutting contact with each other. Although not shown in FIG. 10, the engagement portions 12 installed on the corresponding contact probes 2 may have shapes that allow the engagement portions 12 to be fitted with each other.

Figure 11:
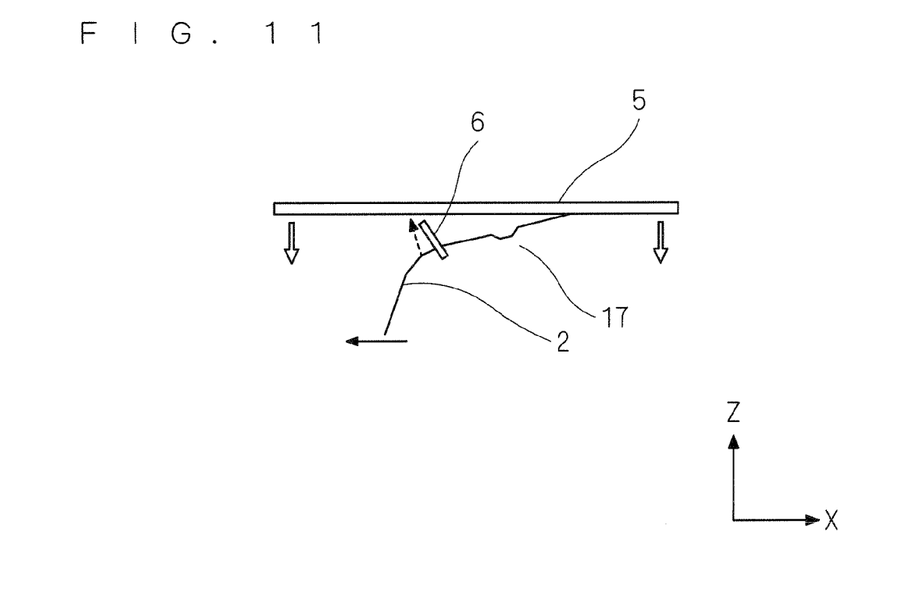

As shown in FIG. 11, another member to make abutting contact with the engagement portion 12 of the engagement member 6 may be the insulating base 5. Employing the structure of FIG. 11 acts effectively in the case where there are no contact probes 2 facing each other, unlike the case of FIG. 6 or 10. The insulating base 5 (or, probe substrate 3) being the another member achieves the effect of letting heat escape, thereby producing more effective heat dissipation.

Second Preferred Embodiment

Figure 12:
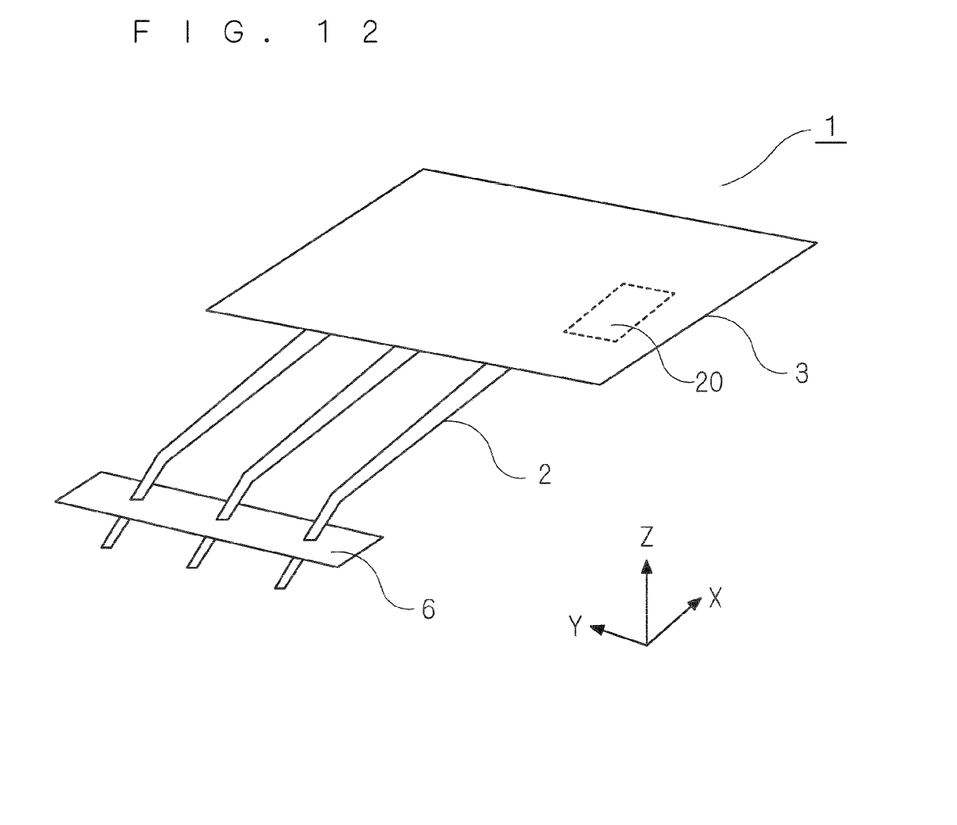
FIG. 12 shows an exemplary structure of a probe card of a second preferred embodiment of the present invention.
Figure 13:
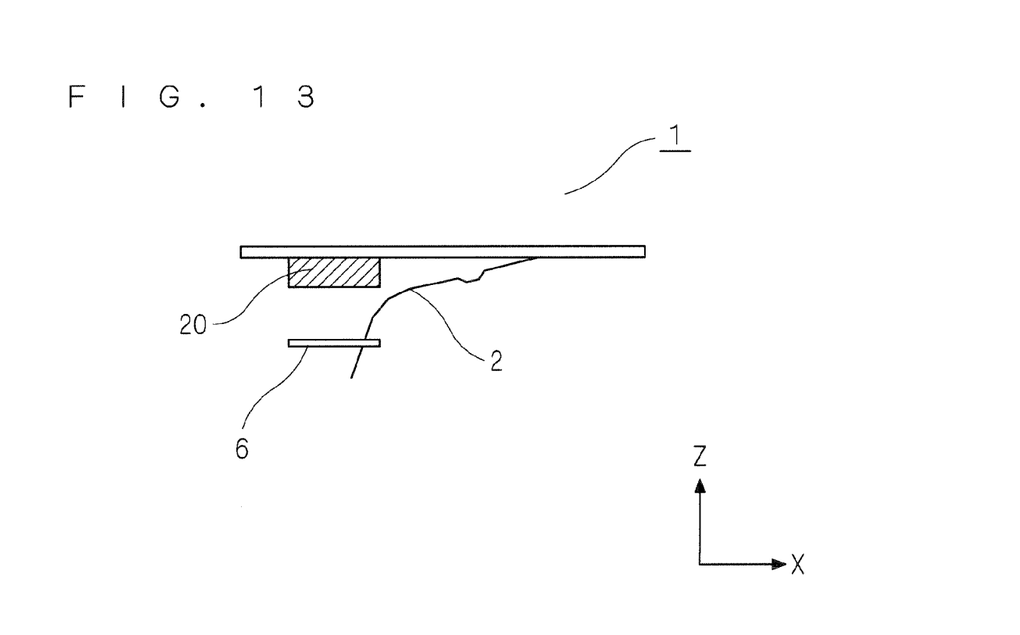
FIG. 13 is a side view of the probe card of the second preferred embodiment of the present invention shown in FIG. 12.

FIG. 12 shows an exemplary structure of a probe card 1 of a second preferred embodiment of the present invention. FIG. 13 is a side view of the probe card 1 of FIG. 12.

As shown in FIG. 12, the probe card 1 of the second preferred embodiment includes a plurality of contact probes 2, and one engagement member 6 is installed on these contact probes 2. A heat dissipating fan 20 (blast fan) is installed on a probe substrate 3. The structure of the probe card 1 of the second preferred embodiment is the same in other respects as that of the first preferred embodiment, so it will not be described again.

The structure of the probe card 1 different from that of the first preferred embodiment is described below by referring to FIGS. 12 and 13.

As shown in FIG. 12, the probe card 1 includes one engagement member 6 installed on three contact probes 2, and the engagement member 6 links the three contact probes 2 together. To be specific, the engagement member 6 is commonly installed on a plurality of contact probes 2. If a plurality of contact probes 2 is installed on the probe substrate 3, respective tip end portions 8 of the contact probes 2 do not contact a connection pad at the same time when the probe card 1 is moved downward, unless the tip end portions 8 have the same height. In this case, a tip end portion 8 having contacted the connection pad first is pressed deeply into the connection pad, thereby generating serious damage on the connection pad. In contrast, if a plurality of contact probes 2 is linked together by one engagement member 6 as shown in FIG. 12, the respective tip end portions 8 of the contact probes 2 are allowed to have substantially the same height. Thus, the tip end portions 8 can contact a connection pad such that a serious indentation is not left in the connection pad.

Further, in the second preferred embodiment, the heat dissipating fan 20 is provided on the probe substrate 3 on a side where the contact probes 2 are installed. The engagement member 6 transfers heat through air. However, efficiency in the heat transfer is reduced as the temperature of ambient air increases. In response, the heat dissipating fan 20 operates to diffuse the ambient air to relieve the temperature increase of the ambient air. As a result, heat dissipating effect can be maintained while efficiency in the heat transfer is not reduced.

As described above, the probe card 1 of the second preferred embodiment prevents contact of a plurality of contact probes 2 with a connection pad under excessive pressure due to difference in height between the contact probes 2, so that generation of a scratch or an indentation in the connection pad is controlled. As a result, the electrical characteristics of a semiconductor device 19 are measured and evaluated at higher reliability, and the yield of the semiconductor device 19 is enhanced. Additionally, installation of the heat dissipating fan 20 controls generation of heat in a connection pad and its vicinity having contacted the contact probe 2. This makes it possible to prevent damage on the connection pad or partial breakdown of the semiconductor device 19. As a result, the yield of the semiconductor device 19 is enhanced.

Third Preferred Embodiment

Figure 14:
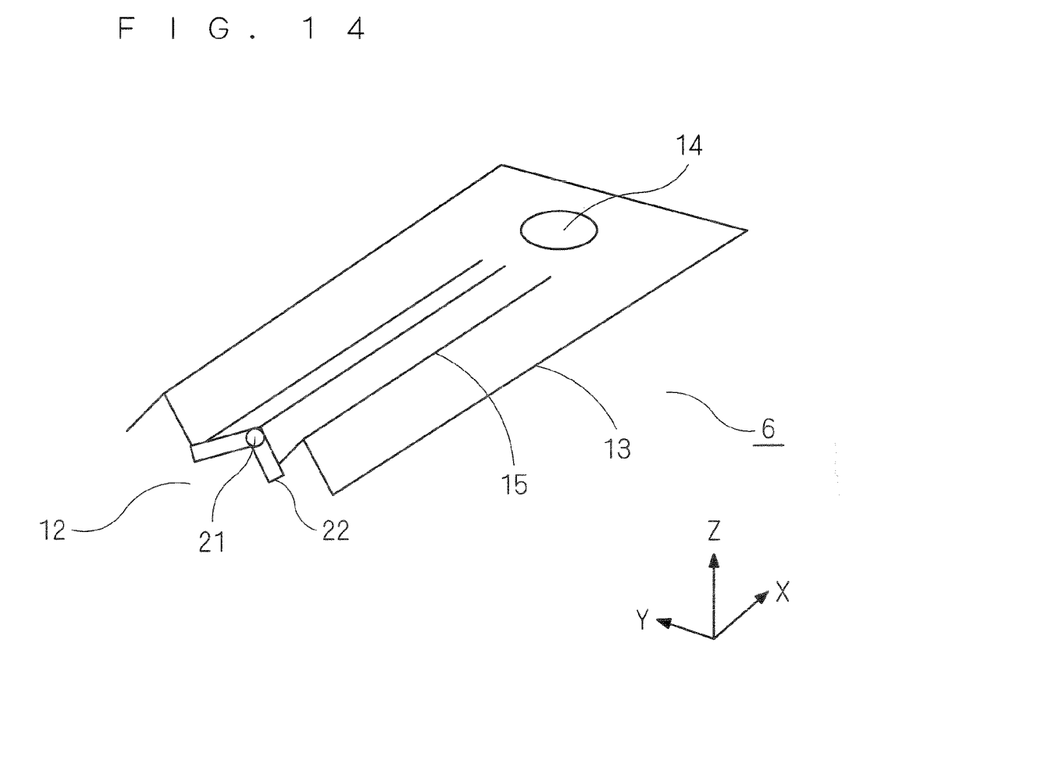
FIG. 14 shows an exemplary shape of an engagement member of a third preferred embodiment of the present invention.
Figure 15:
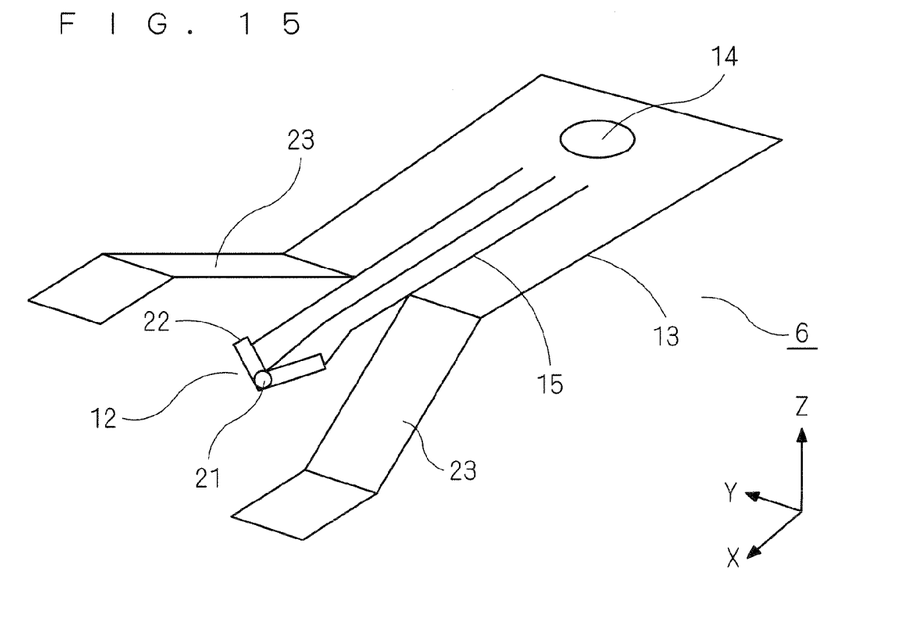
FIG. 15 shows an exemplary shape of another engagement member of the third preferred embodiment of the present invention.

FIG. 14 shows the shape of an engagement member 6 installed on a contact probe 2 of a third preferred embodiment. FIG. 15 shows the shape of an engagement member 6 (also called another engagement member 6 hereinbelow) installed on a contact probe 2 facing the contact probe 2 on which the engagement member 6 of FIG. 14 is installed.

As shown in FIGS. 14 and 15, in the third preferred embodiment, the engagement members 6 of different shapes are installed on the contact probes 2 facing each other, and these engagement members 6 make abutting contact with each other. The structure and the operation of the third preferred embodiment are the same in other respects as those of the first preferred embodiment shown in FIG. 10, so that they will not be described again.

The structure of a probe card 1 of the third preferred embodiment different from that of the first preferred embodiment is described below by referring to FIGS. 14 and 15.

FIG. 14 shows the shape of the engagement member 6 installed on one of the contact probes 2 facing each other. As shown in FIG. 14, an insulating part 22 is provided on a surface of an engagement portion 12 to make abutting contact with the another engagement member 6 of FIG. 15. An electrical contact 21 is formed so as to be exposed from the abutting surface.

FIG. 15 shows the shape of the engagement member 6 (another engagement member) installed on the other of the contact probes 2 facing each other. As shown in FIG. 15, the insulating part 22 is provided on a surface of the engagement portion 12 (hereinafter also called another engagement portion 12) to make abutting contact with the engagement portion 12 of FIG. 14. the electrical contact 21 is formed so as to be exposed from the abutting surface. Guide portions 23 are provided on the opposite sides of the another engagement portion 12 such that the respective tip ends of the guide portions 23 extend in different Z axis directions to be isolated from each other.

The respective operations of the contact probes 2 on which the engagement members 6 shown in FIGS. 14 and 15 are installed are described below.

In response to downward movement of the probe card 1 in the Z axis direction (-Z axis direction), respective tip end portions 8 of the contact probes 2 move so as to get closer to each other in the X axis direction.

When the respective tip end portions 8 of the contact probes 2 get closer to each other, the engagement portion 12 of the engagement member 6 of FIG. 14 installed on the contact probe 2 makes abutting contact with the another engagement portion 12 of the another engagement member 6 of FIG. 15 installed on the another contact probe 2. When the respective electrical contacts 21 of the engagement portions 12 contact each other, the operations of the engagement members 6 are stopped. Stopping the operations of the engagement members 6 also stops the operations of the contact probes 2. When the contact probes 2 are to get closer to each other, their engagement portions 12 may be at positions isolated from each other in the Z axis direction. Even in this case, the engagement portions 12 are guided by the guide portions 23 of FIG. 15 to get closer to each other, thereby allowing abutting contact between the contacts 21. The contacts 21 are connected to an external circuit (not shown in the drawings), so that contact between the contacts 21 can be confirmed electrically.

As described above, the respective shapes of the engagement members 6 shown in FIGS. 14 and 15 make abutting contact between the engagement members 6 mechanically. As a result, the operations of the contact probes 2 can be restrained. Additionally, electrical abutting contact between the engagement members 6 can be confirmed by using the electrical contacts 21, so that the operations of the contact probes 2 are fed back to a circuit (aforementioned external circuit, for example) and monitored. This allows control of the operation of the probe card 1.

In the description above, electrical operation is monitored by using only the electrical contacts. However, this is not the only applicable structure but the structures such as those of FIGS. 16 and 17 are also applicable.

Figure 16:
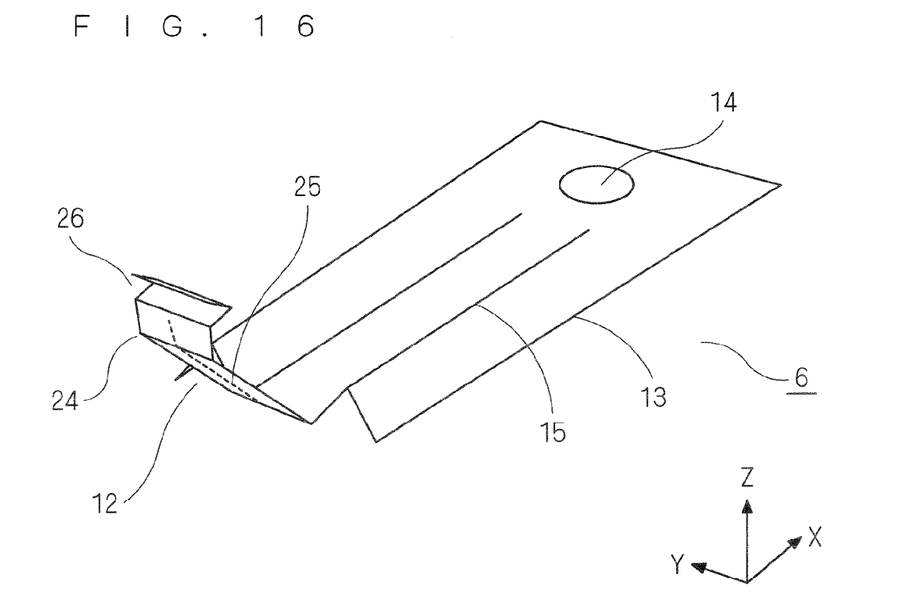
FIG. 16 shows an exemplary shape of the engagement member of the third preferred embodiment of the present invention.

FIG. 16 shows the shape of the engagement member 6 installed on one of contact probes 2 facing each other. As shown in FIG. 16, the engagement portion 12 has a curved projecting part 24, and a strain gauge 25 is provided on the back surface of the curved projecting part 24. It is desirable that the strain gauge 25 be provided at a place that is actually curved. A tip end recessed part 26 is formed at the tip end of the curved projecting part 24.

Figure 17:
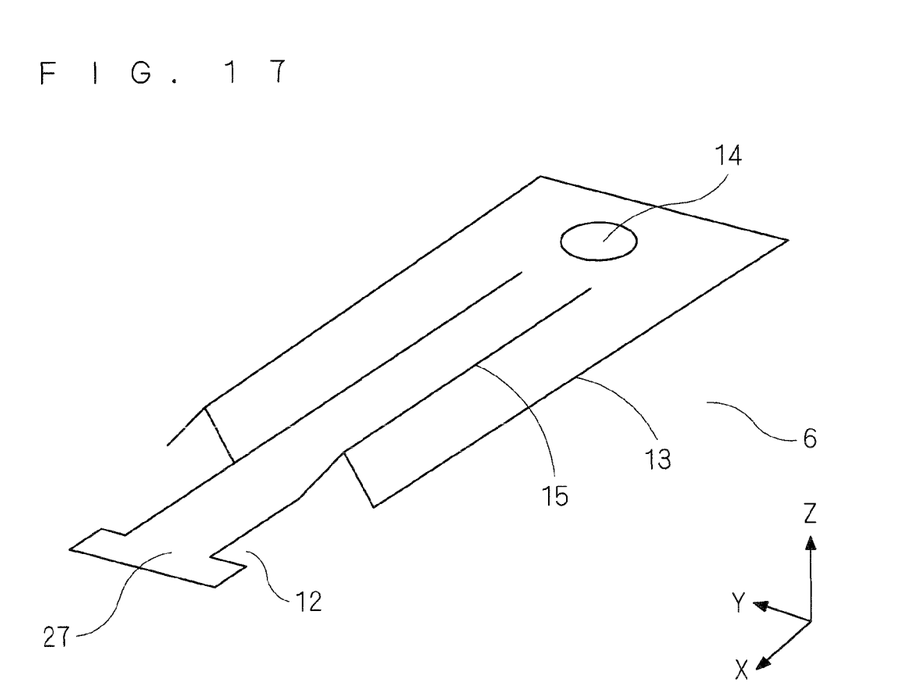
FIG. 17 shows an exemplary shape of the another engagement member of the third preferred embodiment of the present invention.

FIG. 17 shows the shape of the engagement member 6 installed on the other of the contact probes 2 facing each other. As shown in FIG. 17, the engagement portion 12 of the engagement member 6 has a tip end projecting part 27. The tip end projecting part 27 makes abutting contact with the tip end recessed part 26 of the engagement portion 12 of the engagement member 6 shown in FIG. 16 to be fitted with the tip end recessed part 26.

After the tip end recessed part 26 of FIG. 16 and the tip end projecting part 27 of FIG. 17 are fitted with each other, the curved projecting part 24 of the engagement portion 12 of FIG. 16 flexes to make the strain gauge 25 flex. Then, a signal responsive to the flexure of the curved projecting part 24 is output to an external circuit (not shown in the drawings) connected to the strain gauge 25.

As described above, the respective shapes of the engagement members 6 shown in FIGS. 16 and 17 make abutting contact between the engagement members 6 mechanically. As a result, the operations of the contact probes 2 can be restrained. Additionally, the operations of the contact probes 2 are fed back to a circuit (aforementioned external circuit, for example) and monitored based on the output of the strain gauge 25. This allows control of the operation of the probe card 1.

In the description above, a plurality of strain gauges 25 may be provided, and output signals from the corresponding strain gauges 25 may be synthesized.

The strain gauge 25 may be replaced by an element that generates a signal in response to a degree of curvature (extent of curvature) of the curved projecting part 24 (specifically, a signal output element that outputs a certain signal in response to an abutting condition). This element may be a piezoelectric element, for example. Or, a plurality of resistor contacts may be provided. In this case, a position where the resistor contacts contact each other may be monitored as a position where the engagement members 6 are in abutting contact with each other.

As described above, the probe card 1 of the third preferred embodiment prevents contact of the contact probes 2 with a connection pad under excessive pressure by monitoring the operations of the contact probes 2 electrically. Thus, generation of a scratch or an indentation in the connection pad is controlled. As a result, the electrical characteristics of a semiconductor device 19 are measured and evaluated at higher reliability, and the yield of the semiconductor device 19 is enhanced.

The preferred embodiments of the present invention can be combined freely, and each of the preferred embodiments can be modified or omitted where appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A probe card, comprising: a probe substrate: at least one contact probe electrically connected to a signal line provided to an insulating base of said probe substrate and fixed to said insulating base, at least a portion of said contact probe movable with respect to the probe substrate; and at least one engagement member, made of a metallic material, installed on said contact probe at a position near a tip end portion of said contact probe, the engagement member movable with the movement the portion of said contact probe, the engagement member having at least one engagement portion that makes abutting contact with another predetermined member during operation to restrain the operation of said contact probe.

2. The probe card according to claim 1, wherein said another predetermined member includes a contact probe different from said contact probe on which said engagement member is installed, an engagement member different from said engagement member, or said insulating base.

3. The probe card according to claim 1, wherein
said contact probe is provided with at least one stepped part or at least one recessed part formed near said tip end portion of an axial portion of said contact probe, and
said engagement member is installed on said contact probe through said stepped part or said recessed part.

4. The probe card according to claim 1, wherein said contact probe is provided with at least one curved part formed in an axial portion of said contact probe.

5. The probe card according to claim 1, wherein said engagement member has at least one folded part formed by folding process.

6. The probe card according to claim 1, wherein said engagement portion is made of an insulating material.

7. The probe card according to claim 1, wherein
said engagement portion includes an electrical contact formed so as to be exposed from a surface of said engagement portion to make abutting contact with said another predetermined member, and
said electrical contact is capable of contacting an another electrical contact provided to said another predetermined member.

8. The probe card according to claim 1, wherein said engagement portion further includes a signal output element that outputs a certain signal in response to an abutting condition.

9. The probe card according to claim 1, wherein said engagement portion is installed on said contact probe so as to contact at least two places of said contact probe.

10. The probe card according to claim 1, wherein said engagement member is provided with a fin portion on at least one side surface of said engagement member.

11. The probe card according to claim 1, wherein
said contact probe includes a plurality of contact probes, and
said engagement member is commonly installed on said contact probes.

12. The probe card according to claim 1, wherein said probe substrate further includes a blast fan provided on a side where said contact probe is installed.

* * * * *